United States Patent [19]
Ter Laak et al.

[11] Patent Number: 6,023,197
[45] Date of Patent: Feb. 8, 2000

[54] AMPLIFIER SUITABLE FOR CABLE-NETWORK APPLICATIONS

[75] Inventors: Johan W. F. Ter Laak; Hendrikus F. F. Jos, both of Nijmegen, Netherlands

[73] Assignee: U.S. Philips Corporation, New York, N.Y.

[21] Appl. No.: 09/104,899

[22] Filed: Jun. 25, 1998

[30] Foreign Application Priority Data

Jun. 26, 1997 [EP] European Pat. Off. .............. 97201957

[51] Int. Cl.$^7$ ................................ H03F 3/04; H03F 1/14
[52] U.S. Cl. ........................... 330/306; 330/302; 330/292
[58] Field of Search ..................................... 330/302, 306, 330/311, 292, 294

[56] References Cited

U.S. PATENT DOCUMENTS

| | | | |
|---|---|---|---|
| 4,658,220 | 4/1987 | Heston et al. ........................... | 330/311 |
| 4,890,070 | 12/1989 | Benahim et al. ......................... | 330/302 |
| 5,406,226 | 4/1995 | Cioffi et al. ............................. | 330/306 |
| 5,442,323 | 8/1995 | Tikhomirov ............................. | 330/292 |

*Primary Examiner*—Robert Pascal
*Assistant Examiner*—Patricia T. Nguyen
*Attorney, Agent, or Firm*—Leroy Eason

[57] ABSTRACT

An amplifier having an inductive coupling (LL) via which a load (Z1) may be coupled between the two main current terminals (E,C) of a transistor (QA). A capacitive coupling (CC) is also provided between the two main current terminals (E,C). The inductive coupling (LL) and the capacitive coupling (CC) provide, between the two main current terminals (E,C), respective impedances (ZLL, ZCC). To achieve a satisfactory performance in terms of signal distortion and gain, impedances (ZLL, ZCC) are substantially equal in magnitude in at least a portion of a frequency range throughout which the amplifier provides gain. The amplifier is particularly suitable for cable-network applications.

6 Claims, 4 Drawing Sheets

AMPLIFIER SUITABLE FOR CABLE-NETWORK APPLICATIONS

FIELD OF THE INVENTION

The invention relates to an amplifier for providing gain throughout a frequency range. The amplifier may be used, for example, in a cable network to compensate signal losses.

RELATED ART

U.S. Pat. No. 5,442,323 describes a prior-art broad-band amplifier. The broadband amplifier includes a bipolar transistor connected in a common-emitter configuration having base, emitter and collector terminals. The base terminal is connected to an excitation source for the amplifier and the amplifier is connected to a load. An inductor is connected between the emitter terminal of the transistor and a common bus or negative power source terminal. A capacitor is connected between and in parallel with the collector and emitter terminals of the transistor. The values of the capacitor and the inductor, which act as matching components, are calculated to neutralize the reactive component's input and output time lags. U.S. Pat. No. 5,442,323 gives equations to calculate the appropriate values of the inductor and the capacitor.

SUMMARY OF THE INVENTION

It is an object of the invention to provide an amplifier of the above-identified type which, with respect to background art, achieres a better performance in terms of signal distortion. The invention also provides, a cable network and a method of transmitting various signals.

The invention takes the following facts into consideration. A transistor may be regarded as a voltage-controlled current source. It provides an output current at two main current terminals which are generally called collector and emitter if the transistor is bipolar, or drain and source if the transistor is of the field-effect type. The output current varies as a function of an input voltage between a control terminal, for example a base or a gate, and one of the two main current terminals, for example the emitter or the source, which will be referred to as first main current terminal hereinafter. The relation between the output current and the input voltage is generally non-linear.

In the background art, a signal transfer via the amplifier will be largely determined by the aforementioned non-linear relation. Consequently, the background-art amplifier may introduce an appreciable amount of signal distortion. It should be noted that, in the background art, there is an inductive coupling via which the load is coupled between the two main current terminals of the transistor. The inductive coupling is formed by the inductor connected between the emitter of the transistor and signal ground. There is also a capacitive coupling between the two main current terminals in the form of the capacitor connected between and in parallel with the collector and emitter terminals of the transistor.

In accordance with the invention, the inductive coupling and the capacitive coupling provide, between the two main current terminals, respective impedances which are substantially equal in magnitude, in at least a portion of a frequency range throughout which gain is provided. If these impedances are substantially equal in magnitude, the overall impedance between the two main current terminals will be relatively high, in particular if the load has a relatively low impedance. In that case, a change in output current at the two main current terminals will cause a relatively large change in voltage between the two main current terminals. In all practical implementations, there will be a certain impedance between signal ground and the first main current terminal, via. the emitter or the source. As a result, a portion of the voltage change between the two main current terminals will effectively be subtracted from the input voltage, between the control terminal and the first main current terminal, as a function of which the output current varies. This form of feedback reduces the influence of the transistor on the signal transfer via the amplifier which, as a result, will be more linear. Thus, the invention allows a better performance in terms of signal distortion.

Another advantage of the invention resides in the following. It is assumed that the transistor needs to deliver a certain amount of signal power to the load to which it is connected via the inductive coupling. To that end, it needs to apply a certain signal voltage across the load and, consequently, a certain signal voltage between the two main current terminals. As mentioned hereinbefore, the overall impedance between the two main current terminals will be relatively high, if the impedances provided by the inductive coupling and the capacitive coupling are substantially equal in magnitude. Consequently, the transistor only needs to provide a relatively small signal current at the two main current terminals to produce the required signal voltage between two main current terminals such that the load receives the required amount of signal power. Since the transistor only needs to provide a relatively small signal current to effect the aforementioned, relatively little signal power needs to be supplied to the transistor. Thus, the invention allows a satisfactory performance in terms of power gain.

The invention may be used, for example, in a cable network for transmitting various signals. In most cable networks, signals have to be amplified to compensate for any signal losses in a cable. Any amplification is generally accompanied by signal distortion. Signal distortion may cause intermodulation components which coincide in frequency with one or more desired signals. Such intermodulation components will produce noticeable interference even if they have relatively small amplitudes. Thus, signal distortion is an important performance criterion for a cable-network amplifier. Furthermore, the higher the power gain of a cable-network amplifier, the better the signal-to-noise ratio at the end of a cable whose signal losses the cable-network amplifier has to compensate, or the longer the cable may be for a certain signal-to-noise ratio. Thus, power gain is also an important performance criterion for a cable-network amplifier. Since the invention allows a satisfactory performance in terms of signal distortion and power gain, it is particularly suitable for cable-network applications.

The invention and additional features, which may be optionally used to implement the invention to advantage, are apparent from and will be elucidated with reference to the drawings described hereinafter.

DESCRIPTION OF THE PREFERRED EMBODIMENTS

First, some remarks will be made on the use of reference signs. Similar entities are denoted by an identical letter code throughout the drawings. In a single drawing, various similar entities may be shown. In that case, a numeral is added to the letter code, to distinguish similar entities from each other. The numeral will be in parentheses if the number of similar entities is a running parameter. In the description and the claims, any numeral in a reference sign may be omitted if this is appropriate.

Figure 1A:
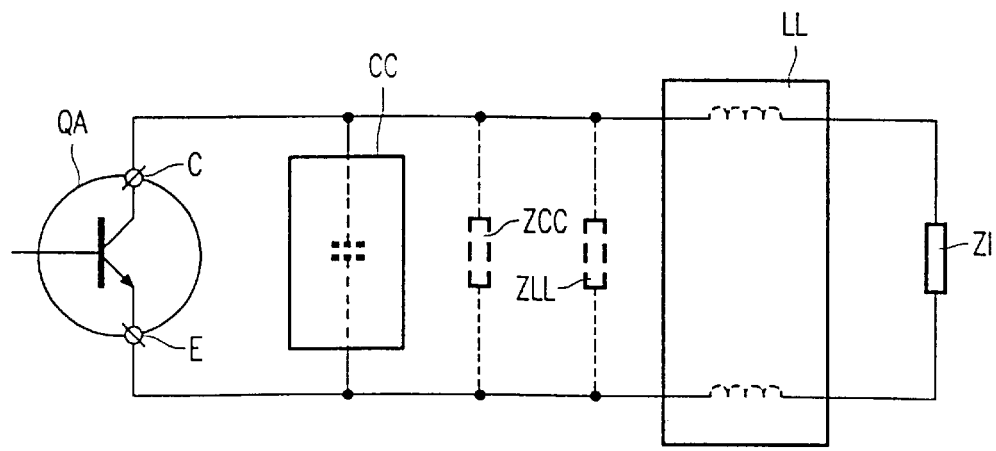
FIGS. 1a and 1b are conceptual diagrams illustrating basic features of the invention.
Figure 1B:
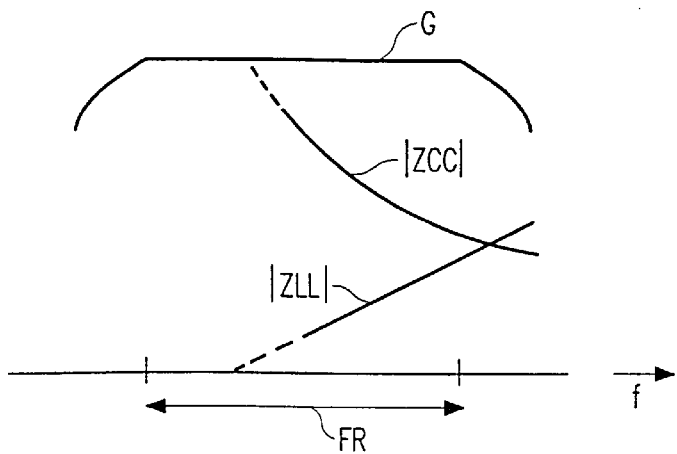

FIGS. 1a and 1b illustrate basic features of the invention. In FIG. 1a, an inductive coupling LL is provided via which a load Z1 may be coupled between two main current terminals, E and C, of a transistor QA. A capacitive coupling CC is also provided between the two main current terminals E and C. The inductive coupling LL and the capacitive coupling CC provide, between the two main current terminals E and C, impedances ZLL and ZCC, respectively.

FIG. 1b is a frequency diagram which illustrates that, throughout a frequency range FR, gain G is provided by an amplifier of which the transistor QA forms part. The frequency range FR may also be described as the passband of the amplifier. FIGS. 1b further illustrates that the impedances ZLL and ZCC are substantially equal in magnitude, in at least a portion of the frequency range FR.

Figure 2:
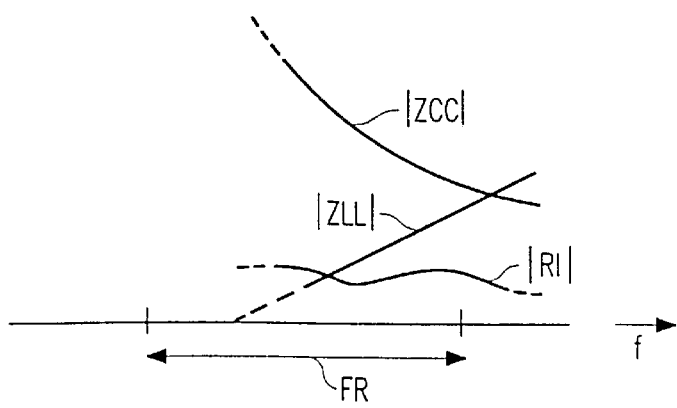
FIGS. 2 to 5 are conceptual diagrams illustrating additional features of the invention.

FIG. 2 illustrates the following additional feature. The load has a resistance R1 which is lower in magnitude than the impedances ZLL and ZCC provided by the inductive coupling and the capacitive coupling, respectively, in the portion of the frequency range in which the impedances ZLL and ZCC are substantially equal in magnitude. As explained hereinbefore in the summary of the invention, in all practical implementations which include the features illustrated in FIGS. 1a and 1b, there will be a form of feedback which reduces the influence of the transistor on the signal transfer which, as a result, will be more linear. If the FIG. 2 feature is applied, the impedance between the two main current terminals will be relatively high which contributes to the strength of the feedback. Thus, the FIG. 2 feature contributes to lowering the signal distortion.

Figure 3:
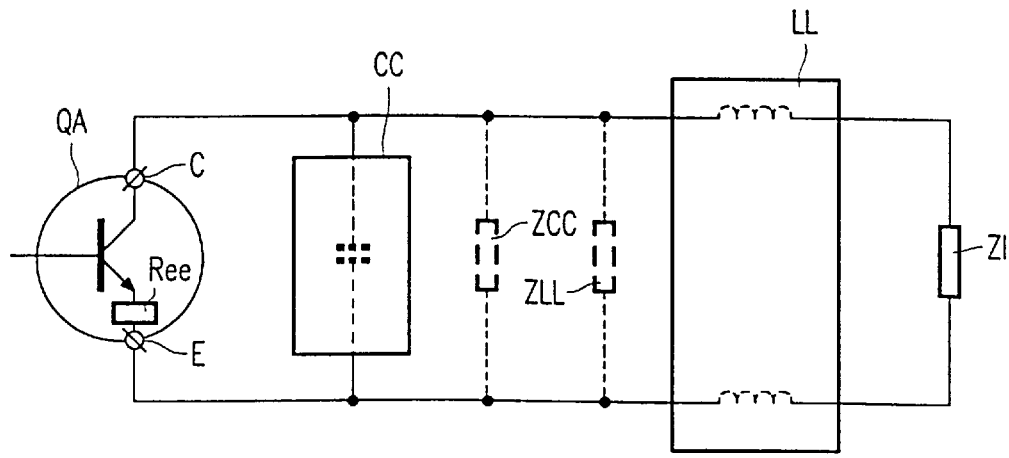

FIG. 3 illustrates the following additional feature. The first of the two main current terminals, which, in FIG. 3, is an emitter E, includes ballast resistors Ree. The ballast resistors Ree may serve, for example, to prevent thermal instability of the transistor QA. In addition, they may also prevent the transistor QA from oscillating as a result of capacitances and inductances to which it is coupled. Thus, the FIG. 3 feature contributes to reliability.

Figure 4:
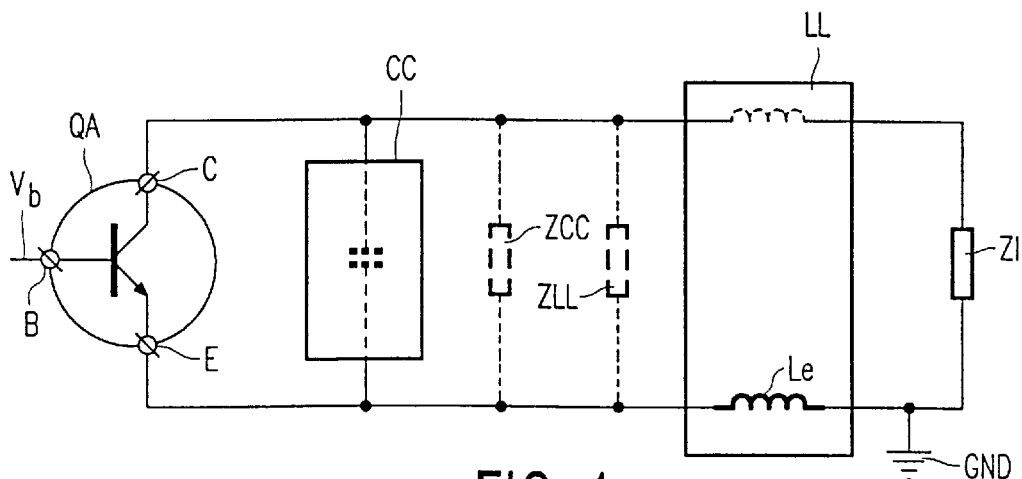

FIG. 4 illustrates the following additional feature. The inductive coupling LL includes an inductance Le which is coupled between signal ground GND and the first of the two main current terminals, which, in FIG. 4, is an emitter E. If the FIG. 4 feature is applied, a substantial portion of a voltage change between the two main current terminals E and C will be present across the inductance Le. Consequently, a substantial portion of the voltage change will effectively be subtracted from a signal Vb at a control terminal B, which signal Vb will have originally caused the voltage change between the two main current terminals E and C. Hence, there will be a relatively strong feedback as a result of which a transfer of the signal Vb to the load Z1 will be influenced by the transistor QA to a relatively small extent only. Thus, the FIG. 4 feature contributes to lowering the signal distortion.

Figure 5:
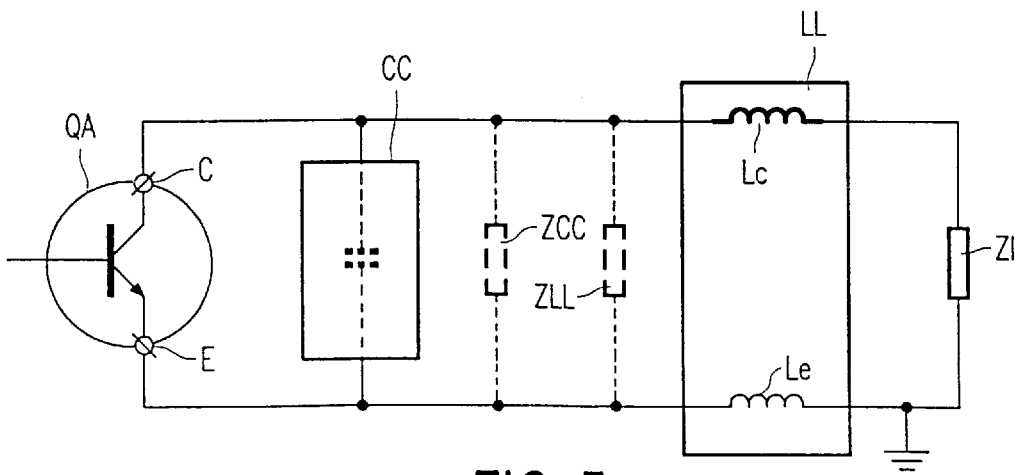

FIG. 5 illustrates the following additional feature to be used in conjunction with the FIG. 4 feature. The inductive coupling LL comprises a further inductance Lc coupled between the load Z1 and the second of the two main current terminals, which, in FIG. 5, is a collector C. The inductance Lc provides a greater degree of freedom to suitably shape a gain-versus-frequency characteristic, particularly at higher frequencies.

Figure 6A:
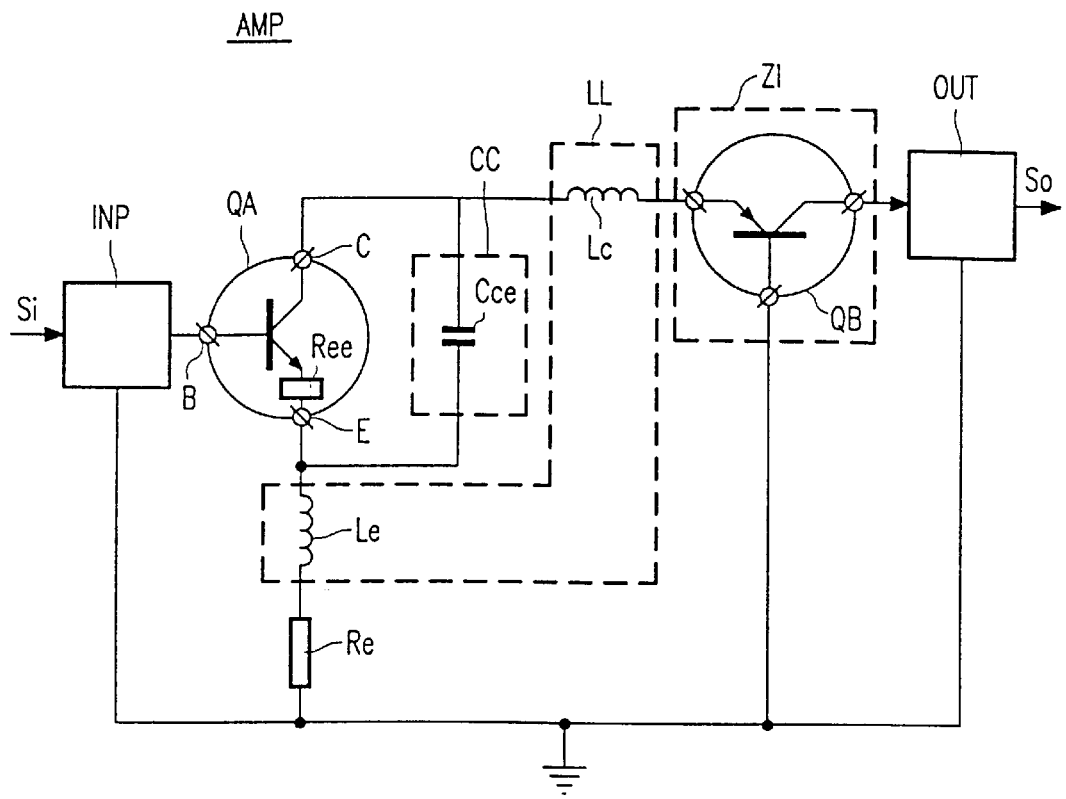
FIG. 6a is a circuit diagram of an example of an amplifier in accordance with the invention.

FIG. 6a illustrates an example of an amplifier in accordance with the invention, which includes the features shown in FIGS. 1 to 5 and described hereinbefore. In the FIG. 6a amplifier, the transistor QA receives an input signal Si at a base B via an input circuit INP. The load Z1 is formed by a transistor QB which is connected in common-base configuration. The capacitive coupling CC is substantially formed by a capacitor Cce connected between the collector C and the emitter E. An emitter-degeneration resistor Re is coupled between the emitter of the transistor QA and signal ground. The transistor QB provides an output signal So via an output circuit OUT.

It is mentioned here that instead of the shown transistor in the FIGS. 1–5 a cascode arrangement of the transistors QA and QB is very advantageous. The transistor QA is operating as a CE (common emitter) stage and the transistor QB is operating as a CB (common base) stage. The CE stage provides a current amplifying and the CB stage provides a voltage amplifying.

Between the CE stage and the CB stage an impedance transformator CC and LL can be placed. Instead of CC and LL also a core with wire wounded around can be used. Further it is possible to use a transformer which is formed having a plurality of first-layer windings (see for example U.S. Pat. No. 5,425,167).

The FIG. 6a amplifier may be applied to advantage, for example, in a cable-television (CATV) network. In such an application, it typically has to provide gain in a frequency range between, for example, 40 and 860 MHz. Listed below are two examples of suitable values for various components in such an application of the FIG. 6a amplifier.

|  | Example 1: |  |  | Example 2: |  |
|---|---|---|---|---|---|
| Cce | = | 7 pF | Cce | = | 15 pF |
| Le | = | 1.5 nH | Le | = | 1 nH |
| Lc | = | 4 nH | Lc | = | 1 nH |
| Re | = | 2 Ω | Re | = | 2 Ω |
| Ree | = | 4 Ω | Ree | = | 4 Ω |

In both examples, the impedances of the inductive coupling and the capacitive coupling are substantially equal in the upper end of the frequency range between 40 and 860 MHz. Furthermore, the load Z1 formed by the transistor QB, has a resistance of about 2 Ω which is substantially lower in magnitude than the impedances of the inductive coupling and the capacitive coupling in the upper end of the frequency range between 40 and 860 MHz. In the upper end, the magnitude of the latter impedances is approximately 28 Ω in example 1, and 13 Ω in example 2. Accordingly, a satisfactory performance in terms of signal distortion is obtained throughout the frequency range.

The ballast resistances Ree substantially contribute to the total emitter resistance which is 6 Ω in both examples. It should be noted that the value of the ballast resistances Ree is higher than needed to achieve thermal stability for which a value of 1.5 Ω would be sufficient. The reason why, nevertheless, the ballast resistances have a relatively high value of 4 Ω is that this contributes to the electrical stability of the FIG. 6a amplifier. In other words, the FIG. 6a amplifier would perform less in terms of electrical stability, if the ballast resistances Ree were 1.5 Ω and the emitter-degeneration resistances Re were 4.5 Ω, instead of, respectively, 4 Ω and 2 Ω as in the examples.

Figure 6B:
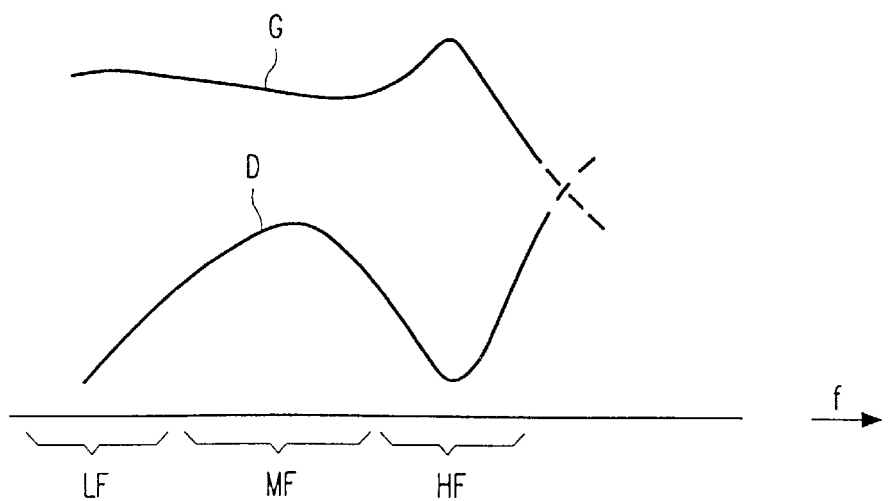
FIG. 6b is a frequency diagram illustrating a gain-versus-frequency and a distortion-versus-frequency characteristic of the FIG. 6a amplifier.

FIG. 6b is a frequency diagram illustrating a gain (G)-versus-frequency characteristic and a distortion (D)-versus-frequency characteristic of the FIG. 6a amplifier. In the FIG. 6b frequency diagram, the frequency range FR, throughout which the FIG. 6a amplifier provides gain, is divided in three portions: a low-frequency portion LF, a medium-frequency portion MF and a high-frequency portion HF. In the low-frequency portion LF, the gain G and distortion D is substantially determined by a total emitter-resistance which is the sum of the emitter-degeneration resistor Re and the ballast resistances Ree. An increase in total emitter-resistance reduces both the gain G and the distortion D. In the. medium-frequency portion MF, the gain (G) is substantially determined by the quotient of the values of the inductance Lc and the inductance Le. The distortion D tends to increase with frequency. In the high-frequency portion HF, the impedances provided by the inductive coupling LL and the capacitive coupling CC are substantially equal. As a result, a favourable reduction in distortion D is obtained.

Figure 6C:
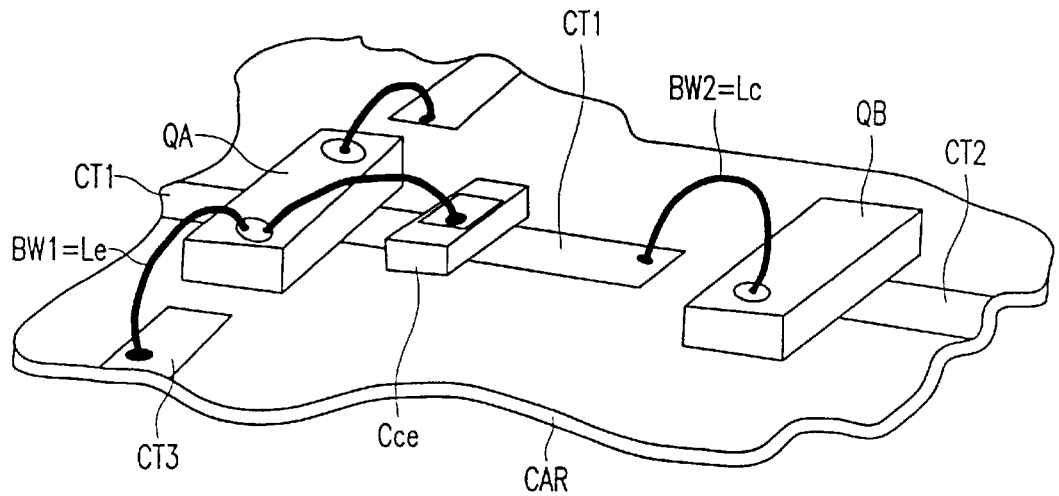
FIG. 6c is a diagram illustrating a physical implementation of the FIG. 6a amplifier.

FIG. 6c illustrates a physical implementation of the FIG. 6a amplifier. The FIG. 6a amplifier is formed on a non-conducting carrier CAR provided with conducting tracks CT. The transistors QA and QB have small rectangular packages of which collector connections are directly soldered to conducting tracks CT1 and CT2, respectively. The inductance Le is formed by a bonding wire BW1 between an emitter connection of transistor QA and conducting track CT3. The inductance Lc is formed by a bonding wire BW2 between an emitter connection of the transistor QB and conducting track CT1. The capacitor Cce has two connections one of which is directly soldered to the conducting track CT1 and the other is connected to an emitter connection of transistor QA via a bonding wire.

Figure 7:
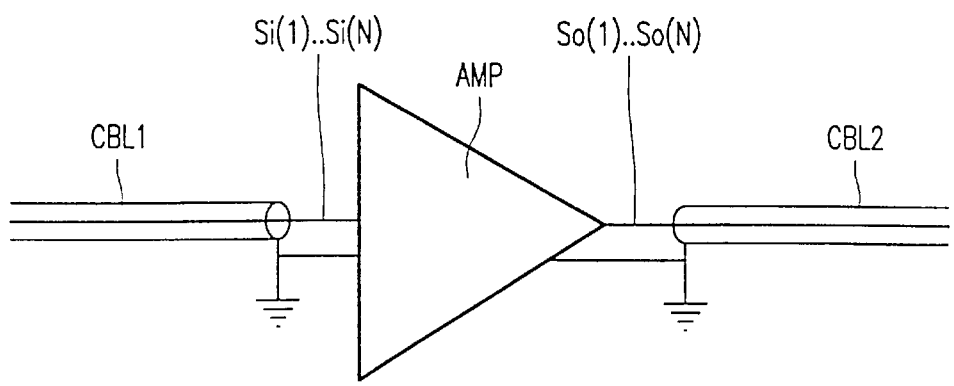
FIG. 7 is a diagram illustrating a cable-network application of the FIG. 6a *amplifier.*

FIG. 7 illustrates an application of the FIG. 6a amplifier AMP in a cable network. The FIG. 6a amplifier AMP receives, via a cable CBL1, various input signals Si(1)... Si(N), N being an integer. It amplifies these signals to obtain output signals So(1)... So(N), respectively, which are transmitted via a further cable CBL2.

It will be evident that there are numerous alternatives which fall within the scope of the appended Claims. In this respect, the following closing remarks are made.

There are numerous ways of physically spreading functions or functional elements over various units. In this respect, the drawings are very diagrammatic, each representing only one possible embodiment of the invention. For example, with reference to FIGS. 1a, the load Z1 may be incorporated in the amplifier of which transistor QA forms part, such as in the FIG. 6a amplifier, but it may also be outside the amplifier. As another example, with reference to FIGS. 1a, the capacitive coupling CC may be substantially formed by a discrete capacitor, such as in the FIG. 6a amplifier, but it may also be integrated in the transistor QA. The latter may be achieved by making the emitter connection sufficiently large in surface area, and by providing a suitable dielectric between the emitter connection and a semiconductor region which belongs to the collector. The area of the semiconductor region which will be in contact with the dielectric should preferably be sufficiently doped to counter any voltage dependency of the capacitive coupling.

In principle, any type of transistor may be used. Although, in the drawings, the transistor QA is represented by means of a symbol commonly used for bipolar transistors, the use of field-effect transistors is by no means excluded. In this respect, it should be noted that the terms emitter, collector and base should be broadly construed so as to include, for example, source, drain and gate, respectively.

In principle, with reference to FIG. 6a, the inductance Le may be omitted. In that case, the emitter-degeneration resistor Re and the ballast resistances Ree will provide a feedback of a voltage across the collector C and the emitter E, which feedback will have a linearizing effect. However, a stronger linearizing effect is obtained if the inductance Le is present as shown in FIG. 6a. Nevertheless, the FIG. 6a amplifier may comprise a feedback network, not shown in FIG. 6a, coupled between, for example, the input circuit INP and the output circuit OUT. Such a feedback network will provide a further linearizing effect which contributes to a low signal distortion.

The term signal ground should be broadly construed so as to include, for example, virtual signal ground. Virtual signal ground is a node which is not directly coupled to signal ground but which, nevertheless, is substantially free of any signals. An example of such a node is a common node between the emitters of two transistors arranged in a differential-pair configuration.

Any reference signs in parentheses shall not be construed as limiting the Claim concerned.

We claim:

1. An amplifier for providing gain over a frequency range (FR), the amplifier comprising:

a transistor (QA) having two main current terminals (E,C);

an inductive coupling (LL) via which a load (Z1) may be coupled between said current terminals (E,C) of said transistor (QA); and a capacitive coupling (CC) between the two main current terminals (E,C), said capacitive and inductive couplings being connected in parallel;

wherein the inductive coupling (LL) and the capacitive coupling (CC) provide between said current terminals (E,C), respective impedances (ZLL,ZCC) which are substantially equal in magnitude over at least a portion of said frequency range (FR).

2. An amplifier as claimed in claim 1, wherein the load has a resistance (R1) which is lower in magnitude than the impedances (ZLL, ZCC) provided by the inductive coupling and the capacitive coupling over the portion of the frequency range in which said impedances are substantially equal in magnitude.

3. An amplifier as claimed in claim 1, wherein a the first of the two main current terminals (E) includes one or more ballast resistors.

4. An amplifier as claimed in claim 1, wherein the inductive coupling (LL) includes an inductance (Le) which is coupled between a signal ground (GND) and the first of the two main current terminals (E).

5. An amplifier as claimed in claim 4, wherein the inductive coupling (LL) further includes an inductance (Lc) coupled between the load (Z1) and the second of the two main current terminals (C).

6. An amplifier as claimed in claim 1, wherein the first-named transistor (QA) is connected as a CE stage and the load is in the form of a second transistor connected as a CB stage, the two stages being coupled in cascode arrangement by a transformer therebetween.

* * * * *